United States Patent
Shin et al.

(10) Patent No.: US 9,761,532 B2
(45) Date of Patent: Sep. 12, 2017

(54) HYBRID INTERCONNECT STRUCTURE AND ELECTRONIC DEVICE EMPLOYING THE SAME

(71) Applicant: Samsung Electronics Co., Ltd., Suwon-si, Gyeonggi-do (KR)

(72) Inventors: Keunwook Shin, Yongin-si (KR); Hyeonjin Shin, Suwon-si (KR); Changhyun Kim, Seoul (KR); Changseok Lee, Siheung-si (KR); Seongjun Park, Seoul (KR); Hyunjae Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/083,827

(22) Filed: Mar. 29, 2016

(65) Prior Publication Data

US 2017/0092592 A1    Mar. 30, 2017

(30) Foreign Application Priority Data

Sep. 25, 2015  (KR) .................. 10-2015-0137086

(51) Int. Cl.
*H01L 23/495* (2006.01)
*H01L 23/532* (2006.01)
*H01L 23/528* (2006.01)

(52) U.S. Cl.
CPC .... *H01L 23/53276* (2013.01); *H01L 23/5283* (2013.01)

(58) Field of Classification Search
CPC .................. H01L 23/53276; H01L 23/5283

USPC ......................................................... 257/668
See application file for complete search history.

(56) References Cited

U.S. PATENT DOCUMENTS

| | | | |
|---|---|---|---|
| 2013/0113102 A1* | 5/2013 | Bao | ............... H01L 21/76846 257/751 |
| 2014/0106561 A1* | 4/2014 | Niyogi | .................. C23C 14/042 438/643 |
| 2014/0291819 A1* | 10/2014 | Barth | ................ H01L 23/53276 257/659 |

(Continued)

FOREIGN PATENT DOCUMENTS

| | | |
|---|---|---|
| KR | 20120066174 A | 6/2012 |
| KR | 20130070962 A | 6/2013 |
| KR | 10-1400821 B1 | 5/2014 |

(Continued)

OTHER PUBLICATIONS

He, et al. "Carbide Bonded Graphene Coating on Silicon Mold for Precision Glass Molding", Department of Integrated Systems Engineering, The Ohio State University. Accessed Jul. 20, 2014 via www.aspe.net/publications/Short%20Abstracts%2013A/3760.

(Continued)

*Primary Examiner* — David S Blum
(74) *Attorney, Agent, or Firm* — Harness, Dickey & Pierce, P.L.C.

(57) ABSTRACT

A hybrid interconnect structure includes a graphene layer between a non-metallic material layer and a metal layer, and a first interfacial bonding layer between the non-metallic material layer and the graphene layer, or the metal layer and the graphene layer. The graphene layer connects the non-metallic material layer and the metal layer, and the first bonding layer includes a metallic material.

20 Claims, 21 Drawing Sheets

(56) References Cited

U.S. PATENT DOCUMENTS

2015/0206748 A1* 7/2015 Sumant ............. H01L 21/02376
                                                          438/481
2015/0333196 A1* 11/2015 Shin ................... H01L 31/0324
                                                          257/29

FOREIGN PATENT DOCUMENTS

KR        20140059588 A  *  5/2014  .............. B82B 1/00
KR        20140075502 A     6/2014

OTHER PUBLICATIONS

Dong, et al. "Graphene Formation on Metal Surfaces Investigated by In-situ STM", Advances in Graphene Science, Chapter 2, pp. 33-54 (2013).

Zou, et al. "Carbon-Forming Groups IVB-VIB Metals: A New Territory in the Periodic Table for CVD Growth of Graphene", Nano Letters, vol. 14, pp. 3832-3839, (2014).

He, et al. "Carbide Bonded Graphene Coating on Silicon Mold for Precision Glass Molding", Department of Integrated Systems Engineering, The Ohio State University.

* cited by examiner

US 9,761,532 B2

HYBRID INTERCONNECT STRUCTURE AND ELECTRONIC DEVICE EMPLOYING THE SAME

CROSS-REFERENCE TO RELATED APPLICATION

This application claims the benefit of Korean Patent Application No. 10-2015-0137086, filed on Sep. 25, 2015, in the Korean Intellectual Property Office, the disclosure of which is incorporated herein in its entirety by reference.

BACKGROUND

1. Field

Example embodiments relate to a hybrid interconnect structure and an electronic device employing the same, and more particularly, to a hybrid interconnect structure employing graphene and an electronic device employing the same.

2. Description of the Related Art

Efforts for reducing a line width or thickness of metal wiring to be used for relatively high-density and relatively high-performance semiconductor devices are being conducted. The number of semiconductor chips integrated for each wafer may increase by reducing a line width or thickness of the metal wiring. In addition, when the thickness of metal wiring is reduced, a capacitance of a line may be reduced, thereby increasing the speed of a signal through the wiring.

However, when a line width or thickness of metal wiring is reduced, resistance increases, and thus, a decrease in resistance of a wiring structure is desirable. A current interconnect technique is approaching a physical limitation region in which a specific resistance increases according to a decrease in line width and thickness.

SUMMARY

Example embodiments provide a hybrid interconnect structure using graphene, of which the adhesion with the graphene is improved, and an electronic device employing the same.

Additional aspects will be set forth in part in the description which follows and, in part, will be apparent from the description, or may be learned by practice of the presented example embodiments.

According to example embodiments, a hybrid interconnect structure includes a graphene layer between a non-metallic material layer and a metal layer, the graphene layer connecting the non-metallic material layer and the metal layer, and a first interfacial bonding layer between the non-metallic material layer and the graphene layer, or the metal layer and the graphene layer, the first bonding layer including a metallic material.

The first interfacial bonding layer may be between the non-metallic material layer and the graphene layer. The first bonding layer may interact with graphene at an interface with the graphene layer to form a carbide, and the first bonding layer may include at least one of titanium (Ti), zirconium (Zr), hafnium (Hf), vanadium (V), niobium (Nb), tantalum (Ta), chromium (Cr), molybdenum (Mo), tungsten (W), and an alloy thereof. The non-metallic material layer may be one of a semiconductor substrate and a semiconductor material layer on a substrate. The non-metallic material layer may include a silicon material, the first bonding layer may interact with graphene layer at an interface with the graphene layer to form a carbide, and the first bonding layer may interact with the silicon at an interface with the non-metallic material layer to form a silicide. The first bonding layer may include a titanium (Ti) layer, the Ti layer may interact with graphene at an interface with the graphene layer to form titanium carbide (TiC), and the Ti layer may interact with the silicon at an interface with the non-metallic material layer to form a titanium silicide (TiSi).

The hybrid interconnect structure may further include a second bonding layer between the graphene layer and the metal layer, the second bonding layer including a metallic material. The second bonding layer may interact with graphene at an interface with the graphene layer to form a carbide, and the second bonding layer may include at least one of Ti, Zr, Hf, V, Nb, Ta, Cr, Mo, W, and an alloy thereof. The second bonding layer may be one of a continuous thin-film and an island pattern.

The first bonding layer may be between the graphene layer and the metal layer. The first bonding layer may interact with graphene at an interface with the graphene layer to form a carbide, and the first bonding layer may include at least one of Ti, Zr, Hf, V, Nb, Ta, Cr, Mo, W, and an alloy thereof.

The graphene layer may include a nanocrystalline graphene layer. The nanocrystalline graphene layer may have at least one of a thickness of 4 mm or less, a 2D/G ratio of a Raman spectrum of 0.1 or more and a D/G ratio of 3 or less, and a crystal size of 1 nm or more. The nanocrystalline graphene layer may have a crystal size in a range of about 1 nm to about 200 nm. The nanocrystalline graphene layer may be on the non-metallic material layer. The first bonding layer may be between the non-metallic material layer and the nanocrystalline graphene layer, the nanocrystalline graphene layer may interact with the first bonding layer to form a carbide, and the nanocrystalline graphene layer may contact the first bonding layer.

According to example embodiments, an electronic device includes a plurality of elements, each of the plurality of elements including at least one of a transistor, a capacitor, and a resistor, and the hybrid interconnect structure of example embodiments configured to connect at least one of the plurality of elements, components within each element, unit cells formed by combining the plurality of elements, and chips manufactured by combining a plurality of unit cells.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
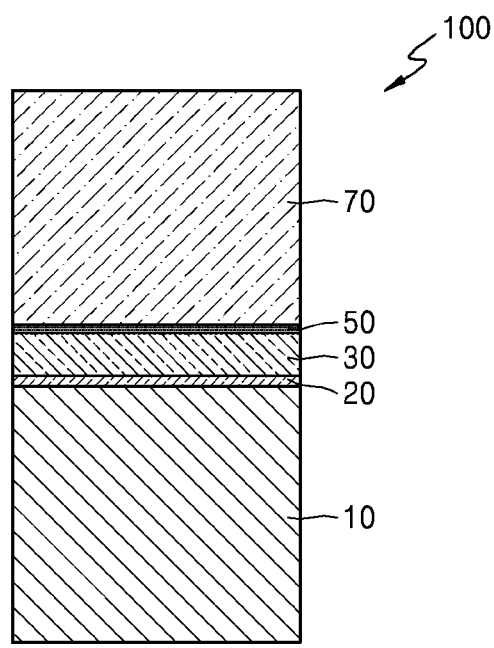
FIGS. 1 through 6 illustrate cross-sectional views of hybrid interconnect structures according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Example embodiments of the present inventive concepts will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Hereinafter, a hybrid interconnect structure employing graphene and an electronic device employing the same are described in detail with reference to the accompanying drawings. In the specification, when it is described that one layer is provided "above", "on an upper part of", or "on" a substrate or another layer, the layer may be on the substrate or another layer directly or via another layer in the middle.

Graphene that is a two-dimensional material may form a hybrid structure together with a conductive material, e.g., a metal, polysilicon, etc., used for a wiring structure, thereby decreasing both a line width and a resistance of wiring. A specific resistance of a general metal increases when the thickness of the metal is reduced, whereas graphene has a constant specific resistance regardless of the thickness of the graphene. Therefore, a specific resistance may be reduced by inserting graphene between actual wiring structures of a multi-stack structure. Examples of a metal used for a wiring structure may include titanium nitride (TiN), tungsten (W), a tungsten-palladium alloy (W—Pd), tungsten silicide (WSix), titanium silicon nitride (TiSiN), cobalt (Co), ruthenium (Ru), copper (Cu), nickel (Ni), NiSi, CoSi, CuSi, FeSi, MnSi, RuSi, RhSi, IrSi, PtSi, TiSi, WSi, etc.

FIG. 1 illustrates a cross-sectional view of a hybrid interconnect structure 100 according to example embodiments.

Referring to FIG. 1, the hybrid interconnect structure 100 according to example embodiments may include a non-metallic material layer 10, a metal layer 70, a graphene layer 30 interconnecting the non-metallic material layer 10 and the metal layer 70, and a first bonding layer 20 for interfacial bonding between the non-metallic material layer 10 and the graphene layer 30. The hybrid interconnect structure 100 according to example embodiments may further include a second bonding layer 50 for interfacial bonding between the graphene layer 30 and the metal layer 70.

The non-metallic material layer 10 may be a material layer formed on a substrate and include a semiconductor material or a semiconductor substrate. For example, the non-metallic material layer 10 may include a silicon material. That is, the non-metallic material layer 10 may be a silicon substrate or a material layer formed on a substrate and including a silicon material. For example, the silicon material may be polysilicon (poly-Si). The metal layer 70 may include, for example, tungsten (W), etc. The metal layer 70 may include another type of metallic material. For example, the metal layer 70 may include a metallic material including aluminum (Al) or copper (Cu).

The graphene layer 30 may form carbide on the first bonding layer 20 and contact the first bonding layer 20. The graphene layer 30 may include a nanocrystalline graphene layer. The nanocrystalline graphene layer may be, for example, deposited or grown on the first bonding layer 20. The nanocrystalline graphene layer may be formed to satisfy at least one of the conditions that a thickness is 4 mm or less, a 2D/G ratio of a Raman spectrum is 0.1 or more and a D/G ratio thereof is 3 or less, and a crystal size is 1 nm or more. For example, the crystal size of the nanocrystalline graphene layer may be in a range of about 1 nm to about 200 nm.

The nanocrystalline graphene layer may be doped with a doping element so as to decrease the resistance of the hybrid interconnect structure 100, according to example embodiments. The doping may be performed by spin-coating the doping element. Examples of the doping element may include gold chloride ($AuCl_3$), dichlorodicyanoquinone (DDQ), BV, etc. Herein, $AuCl_3$ is a p-type doping element (dopant), and BV is an n-type doping element (dopant).

Besides the dopants above, various types of p- or n-types of doping elements may be used to dope the nanocrystalline graphene layer.

That is, as the doping element, various types of organic dopants and/or inorganic dopants may be used. For example, the doping element may include at least one dopant selected from an organic p-dopant group consisting of $NO_2BF_4$, $NOBF_4$, $NO_2SbF_6$, HCl, $H_3PO_4$, $CH_3COOH$, $H_2SO_4$, $HNO_3$, DDQ, oxon, dimyristoyl phosphatidylinositol, and methanesulfonamide trifluoroacetate, an inorganic p-dopant group consisting of $HPtCl_4$, $AuCl_3$, $HAuCl_4$, AgOTfs, $AgNO_3$, $H_2PdCl_6$ $Pd(OAc)_2$, and $Cu(CN)_2$, and an organic n-dopant group consisting of reduced substances of substituted or non-substituted nicotine amide, reduced substances of compounds chemically bonded with substituted or non-substituted nicotine amide, and compounds which include two or more pyridinium derivatives in a molecular structure and in which nitrogen in a chain of one or more pyridinium derivatives is reduced.

A compound chemically bonded with the reduced substance of nicotine amide may include NMNH, NADH, and NADPH.

In addition, the compounds which include two or more pyridinium derivatives in a molecular structure and in which nitrogen in a chain of one or more pyridinium derivatives is reduced may include viologen. The viologen may be selected from a group consisting of 1,1'-dibenzyl-4,4'-bipyridinium chloride, methyl viologen dichloride hydrate, ethyl viologen diperchlorate, 1,1'-dioctadecyl-4,4'-bipyridinium dibromide, and dioctyl bis(4-pyridyl)biphenyl viologen. In addition, the viologen may include a conjugatable molecular structure in the middle of a bipyridyl structure. The conjugatable molecular structure may include aryl, alkenyl, or alkynyl.

The graphene layer 30 may further include a transferred graphene layer formed by transferring separately formed high-quality graphene onto the nanocrystalline graphene layer. That is, the graphene layer 30 may include the nanocrystalline graphene layer and the transferred graphene layer. In this case, the transferred graphene layer may include, for example, 1- to 30-layer graphene. For example, the transferred graphene layer may include multilayer graphene (MLG). The transferred graphene layer may have a layer thickness of, for example, about 10 nm or less.

Even when the graphene layer 30 includes the nanocrystalline graphene layer and the transferred graphene layer, at least one of the nanocrystalline graphene layer and the transferred graphene layer may be doped with the doping element described above to decrease the resistance of the hybrid interconnect structure 100.

As described above, because the nanocrystalline graphene layer is directly grown on the first bonding layer 20 and the transferred graphene layer is formed by transferring separately formed relatively high-quality graphene onto the nanocrystalline graphene layer, the limitation of process conditions may be overcome when the hybrid interconnect structure 100 is formed. For example, when an electronic device employing the hybrid interconnect structure 100 according to example embodiments is a memory device, a process temperature for forming the hybrid interconnect structure 100 may be limited to about 700° C. As is well known, to grow high-quality graphene, a growth temperature of about 900° C. to about 1000° C. is necessary, and a catalytic metal is also limited. Because nanocrystalline graphene may be grown at a process temperature limited to about 700° C. without the limitation of a catalytic metal, the hybrid interconnect structure 100 according to example embodiments may be applied to a memory device, etc., without the limitation of a process temperature.

Figure 2:
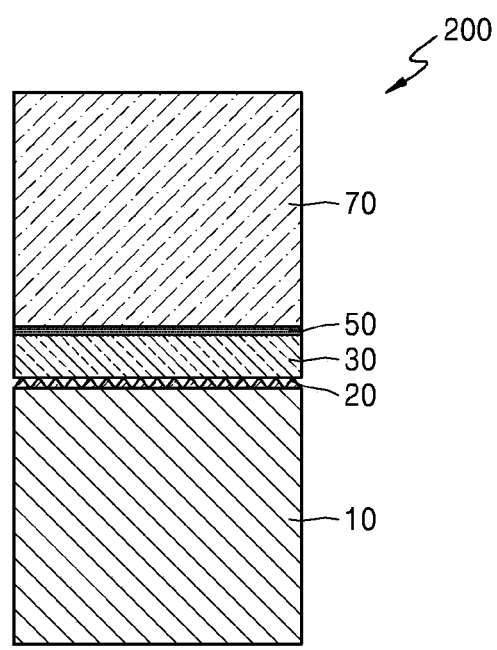

The first bonding layer 20, which forms interfacial bonding between the non-metallic material layer 10 and the graphene layer 30, may be formed using a metallic material. The first bonding layer 20 may form carbide at an interface with the graphene layer 30. For example, the first bonding layer 20 may include at least one metallic material selected from among Ti, zirconium (Zr), hafnium (Hf), vanadium (V), niobium (Nb), tantalum (Ta), chromium (Cr), molybdenum (Mo), W, or an alloy thereof. Besides the materials above, the first bonding layer 20 may be formed using various metallic materials. The first bonding layer 20 may be formed in a continuous thin-film form, as shown in FIG. 1. Alternatively, the first bonding layer 20 may be formed in an island form such that the first bonding layer 20 partially exists, as shown in FIG. 2 to be described below.

When the non-metallic material layer 10 includes a silicon material and the first bonding layer 20 forms interfacial bonding between the non-metallic material layer 10 and the graphene layer 30, the first bonding layer 20 may form carbide at the interface with the graphene layer 30 and form silicide at an interface with the non-metallic material layer 10.

For example, the first bonding layer 20 may be a Ti layer. In this case, the first bonding layer 20 may form carbide, e.g., TiC, at the interface with the graphene layer 30 and form silicide, e.g., TiSi, at the interface with the non-metallic material layer 10.

Figure 5:
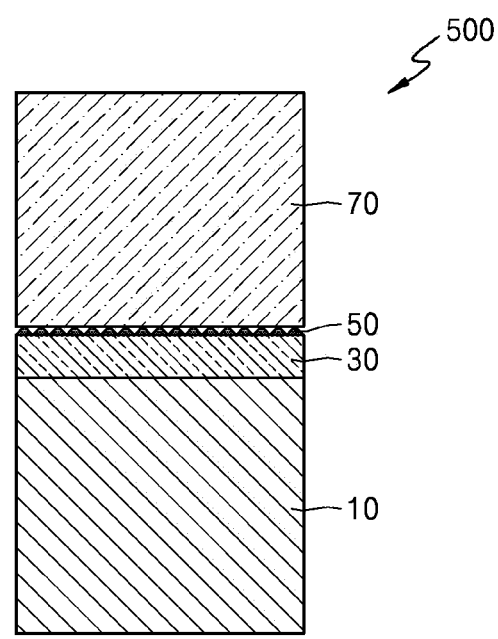

The second bonding layer 50, which forms interfacial bonding between the graphene layer 30 and the metal layer 70, may be formed using a metallic material. The second bonding layer 50 may form carbide at an interface with the graphene layer 30. For example, the second bonding layer 50 may include at least one metallic material selected from among Ti, Zr, Hf, V, Nb, Ta, Cr, Mo, W, or an alloy thereof to form carbide at the interface with the graphene layer 30. Besides the materials above, the second bonding layer 50 may be formed using various metallic materials. For example, the second bonding layer 50 may be a Ti layer. In this case, the second bonding layer 50 may form carbide, e.g., TiC, at the interface with the graphene layer 30. The second bonding layer 50 may be formed in a continuous thin-film form, as shown in FIG. 1. Alternatively, the second bonding layer 50 may be formed in an island form such that the second bonding layer 50 partially exists, as shown in FIG. 5 to be described below.

In the hybrid interconnect structure 100 described above, an adhesion between the non-metallic material layer 10 and the graphene layer 30 and an adhesion between the graphene layer 30 and the metal layer 70 may be improved by inserting the first bonding layer 20 and the second bonding layer 50 of a metallic material between the non-metallic material layer 10 and the graphene layer 30 and between the graphene layer 30 and the metal layer 70, respectively. The first bonding layer 20 between the non-metallic material layer 10 and the graphene layer 30 may have an improved adhesion at an interface between the first bonding layer 20 and the graphene layer 30 by applying a metal capable of forming carbide at the interface. Likewise, the second bonding layer 50 between the graphene layer 30 and the metal layer 70 may have an improved adhesion by forming carbide at an interface between the second bonding layer 50 and the graphene layer 30 and may reduce or prevent deterioration of a material property, etc., due to defects of a grain boundary of graphene, etc. In addition, the first bonding layer 20 and the second bonding layer 50 may function as a diffusion reduction layer.

In addition, in the hybrid interconnect structure 100 described above, while forming the second bonding layer 50 and the metal layer 70 of a metal material on the graphene layer 30, a grain size of the second bonding layer 50 and the metal layer 70 may expand. Therefore, a resistance of the second bonding layer 50 and the metal layer 70 is reduced, thereby reducing a total resistance of the hybrid interconnect structure 100.

FIG. 2 illustrates a cross-sectional view of a hybrid interconnect structure 200 according to example embodiments. The hybrid interconnect structure 200 differs from the hybrid interconnect structure 100 of FIG. 1 in that the first bonding layer 20 is formed in an island form such that the first bonding layer 20 partially exists. Although FIG. 2 shows a case where only the first bonding layer 20 is formed in an island form such that the first bonding layer 20 partially exists, the hybrid interconnect structure 200 may be formed such that the first bonding layer 20 is formed in a continuous thin-film form and the second bonding layer 50 is formed in an island form such that the second bonding layer 50 partially exists. Alternatively, the first bonding layer 20 and the second bonding layer 50 may be formed in an island form such that both the first bonding layer 20 and the second bonding layer 50 partially exist.

Figure 3:
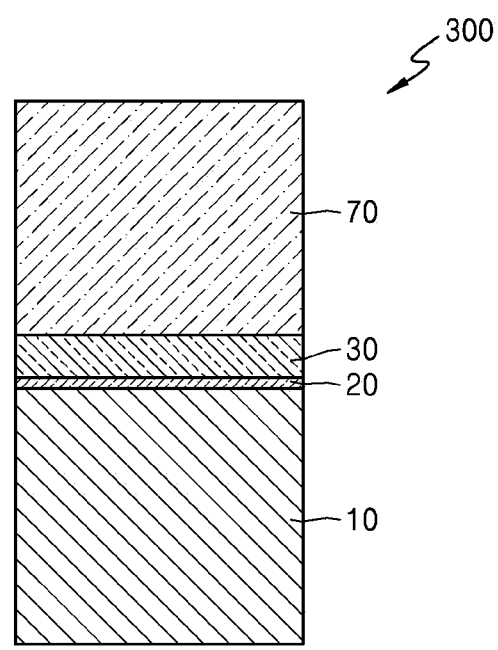

FIG. 3 illustrates a cross-sectional view of a hybrid interconnect structure 300 according to example embodiments. The hybrid interconnect structure 300 differs from the hybrid interconnect structure 100 of FIG. 1 in that the first bonding layer 20 is provided only between the non-metallic material layer 10 and the graphene layer 30. That is, the hybrid interconnect structure 300 according to example embodiments does not include the second bonding layer 50 between the graphene layer 30 and the metal layer 70.

Figure 4:
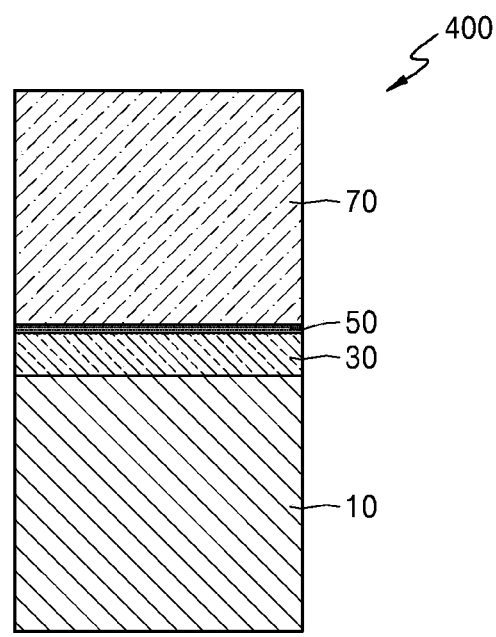

FIG. 4 illustrates a cross-sectional view of a hybrid interconnect structure 400 according to example embodiments. The hybrid interconnect structure 400 differs from the hybrid interconnect structure 100 of FIG. 1 in that the second bonding layer 50 is provided only between the graphene layer 30 and the metal layer 70. That is, the hybrid interconnect structure 400 according to example embodiments does not include the first bonding layer 20 between the non-metallic material layer 10 and the graphene layer 30.

FIG. 5 illustrates a cross-sectional view of a hybrid interconnect structure 500 according to example embodiments. The hybrid interconnect structure 500 differs from the hybrid interconnect structure 400 of FIG. 4 in that the second bonding layer 50 is formed in an island form such that the second bonding layer 50 partially exists.

The hybrid interconnect structures 100, 200, 300, 400, and 500 according to example embodiments which have been described with reference to FIGS. 1 through 5 include at least one of the first bonding layer 20 forming interfacial bonding between the non-metallic material layer 10 and the graphene layer 30 and the second bonding layer 50 forming interfacial bonding between the graphene layer 30 and the metal layer 70. According to the hybrid interconnect structures 100, 200, 300, 400, and 500, by providing the first bonding layer 20 forming interfacial bonding between the non-metallic material layer 10 and the graphene layer 30, carbide having stronger bonding at an interface during the growth of the graphene layer 30 than relatively weak interfacial bonding between the graphene layer 30 and the non-metallic material layer 10, e.g., a polysilicon layer, is formed, and thus an adhesive characteristic may be improved. In addition, by providing the second bonding layer 50 forming interfacial bonding between the graphene layer 30 and the metal layer 70, carbide having stronger bonding at an interface between the second bonding layer 50 and the graphene layer 30 than relatively weak interfacial bonding between the graphene layer 30 and the metal layer 70 is formed, and thus an adhesive characteristic may be improved.

In a hybrid interconnect structure, an interface between material layers may be more easily separated due to stress applied after depositing an additional metal or dielectric on the hybrid interconnect structure. However, according to the hybrid interconnect structures 100, 200, 300, 400, and 500, as described below, an interface between material layers may be reduced or prevented from being separated due to stress applied after depositing an additional metal or dielectric on the hybrid interconnect structure 100, 200, 300, 400, or 500.

Figure 6:
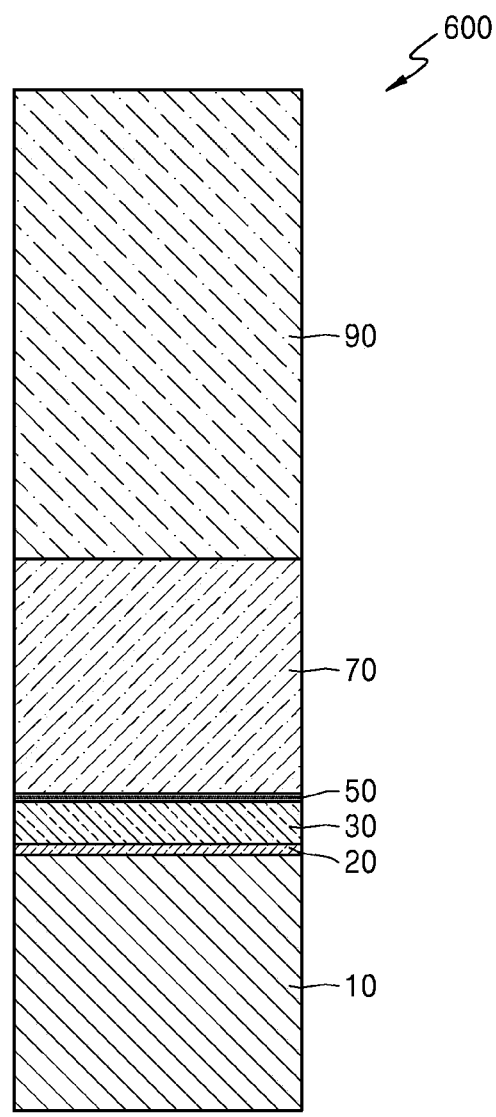

FIG. 6 illustrates a structure in which an additional material layer, e.g., a dielectric layer 90, is further formed on a hybrid interconnect structure 600 according to example embodiments. FIG. 6 shows an example in that the hybrid interconnect structure 100 of FIG. 1 is applied to the hybrid interconnect structure 600 further including the dielectric layer 90. Alternatively, any one of the hybrid interconnect structures 200, 300, 400, and 500 may be applied to the hybrid interconnect structure 600 of FIG. 6.

Figure 7:
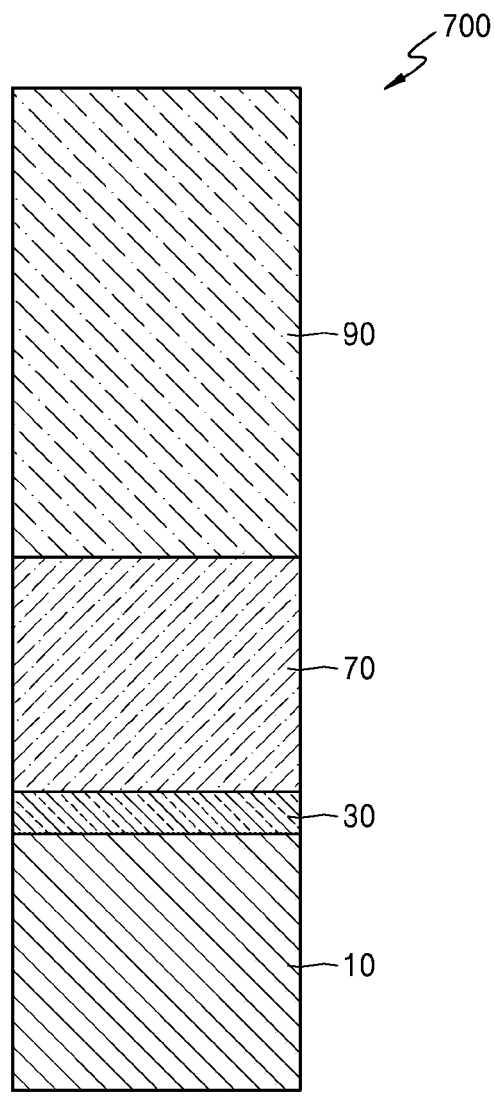
FIG. 7 illustrates a cross-sectional view of a hybrid interconnect structure as a comparative example.

FIG. 7 illustrates a cross-sectional view of a hybrid interconnect structure 700 as a comparative example. The hybrid interconnect structure 700 as the comparative example includes the non-metallic material layer 10, the graphene layer 30, and the metal layer 70. An additional material layer, e.g., the dielectric layer 90, is further formed on the metal layer 70, for example, the hybrid interconnect structure 600 of FIG. 6.

For an example, the non-metallic material layer 10 may be a silicon substrate, the metal layer 70 may be formed of W, and the dielectric layer 90 may be formed of SiNx, in FIGS. 6 and 7.

Figure 8:
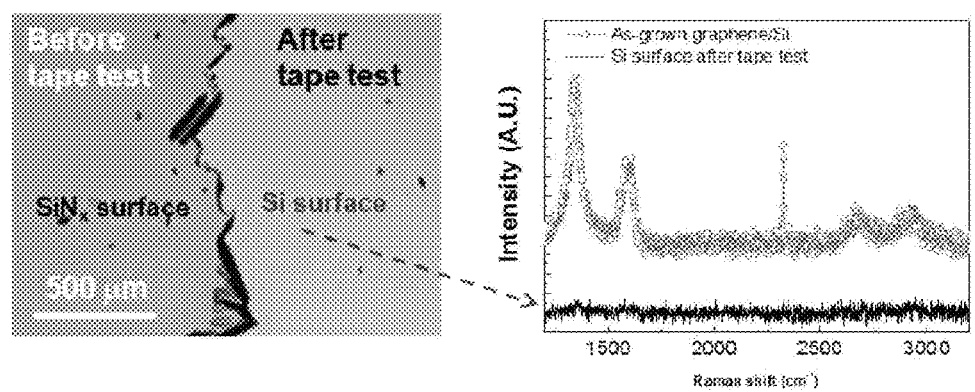
FIG. 8 illustrates an adhesive characteristic test result of the hybrid interconnect structure as the comparative example.

FIG. 8 illustrates an adhesive characteristic test result of the hybrid interconnect structure 700 as the comparative example, wherein an image on the left shows surfaces of a comparative sample before a tape test and after the tape test, and a graph on the right shows a Raman shift characteristic when graphene is grown on the silicon substrate of the comparative example (As-grown graphene/Si) and a Raman shift characteristic of an exposed silicon surface after the tape test.

As shown in FIG. 8, for the comparative example, an SiNx surface was observed before the tape test, but an Si surface was observed after the tape test. In addition, according to the Raman shift characteristic, a graphene peak appeared for the sample in a state where graphene is grown on the silicon substrate, but no graphene peak appeared after the tape test.

With reference to FIG. 8, due to relatively weak interfacial bonding between graphene and silicon, a graphene layer and the silicon substrate are more easily separated from each other according to stress applied according to the metal layer 70 of additional deposition of the dielectric layer 90.

Figure 9:
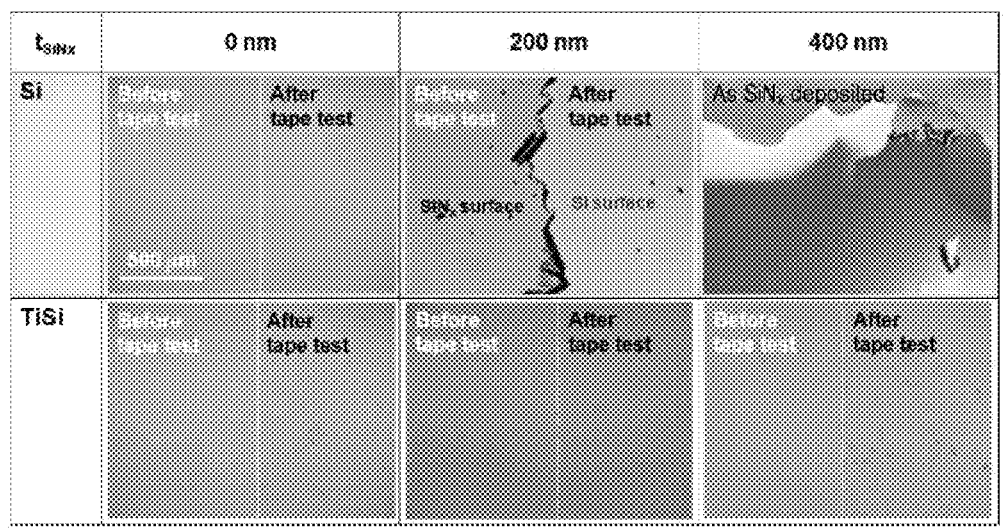
FIG. 9 illustrates an adhesive characteristic test result of a hybrid interconnect structure according to example embodiments.

FIG. 9 illustrates an adhesive characteristic test result of the hybrid interconnect structure 600 according to example embodiments, wherein when thicknesses of an SiNx layer are about 0 nm, about 200 nm, and about 400 nm, surfaces of samples having a Ti layer as the first bonding layer 20 inserted between the graphene layer 30 and the non-metallic material layer 10, e.g., the silicon substrate, are compared with surfaces of comparative samples having no inserted Ti layer before the tape test and after the tape test. In FIG. 9, images in an "Si" line show the surfaces of the comparative samples having no inserted Ti layer before the tape test and after the tape test. In FIG. 9, images in a "TiSi" line show the surfaces of the samples having an inserted Ti layer before the tape test and after the tape test.

Referring to FIG. 9, when the thickness of the SiNx layer is about 0 nm (i.e., before forming the SiNx layer, an interface between the graphene layer 30 and the silicon substrate was not separated from each other regardless of whether the Ti layer is inserted.

When the thickness of the SiNx layer is about 200 nm, after the tape test, the interface between the graphene layer 30 and the silicon substrate was separated from each other for a case where the Ti layer was not inserted, and thus, a surface of the silicon substrate (Si surface) of the comparative sample was exposed. However, for the sample, when silicide, i.e., TiSi, was formed at an interface between the Ti layer and the silicon substrate and carbide, i.e., TiC, was formed between the Ti layer and the graphene layer 30 by inserting the Ti layer between the silicon substrate and the graphene layer 30, even when the SiNx layer was formed with a thickness of about 200 nm, the interface between the graphene layer 30 and the silicon substrate was not separated.

When the thickness of the SiNx layer is about 400 nm, cracks occurred in the comparative sample having no inserted Ti layer, but the sample having an inserted Ti layer has improved adhesion by forming silicide, i.e., TiSi, at the interface between the Ti layer and the silicon substrate and forming carbide between the Ti layer and the graphene layer 30, and thus the interface between the graphene layer 30 and the silicon substrate was not separated before and after the tape test.

Figure 10:
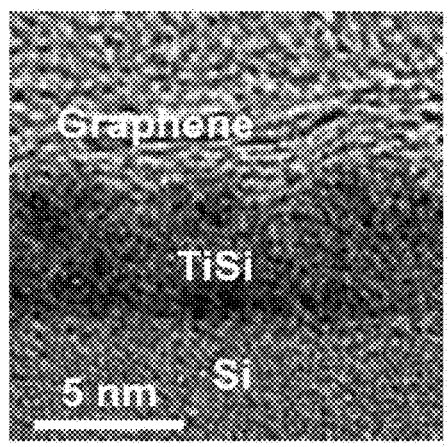
FIG. 10 illustrates a cross-sectional image of a hybrid interconnect structure according to example embodiments.

FIG. 10 illustrates a cross-sectional image of a hybrid interconnect structure according to example embodiments, wherein silicide, i.e., TiSi, is formed at an interface of the graphene layer 30 and the silicon substrate, i.e., Ti/Si, when a Ti layer is inserted between the graphene layer 30 and the silicon substrate.

When the Ti layer is inserted between the graphene layer 30 and the silicon substrate, carbide, i.e., TiC, having strong bonding at an interface during the growth of graphene is formed between the graphene layer 30 and the Ti layer, and thus an adhesive characteristic may be improved. In addition, silicide may be formed at an interface between the silicon substrate and the Ti layer.

Figure 11:
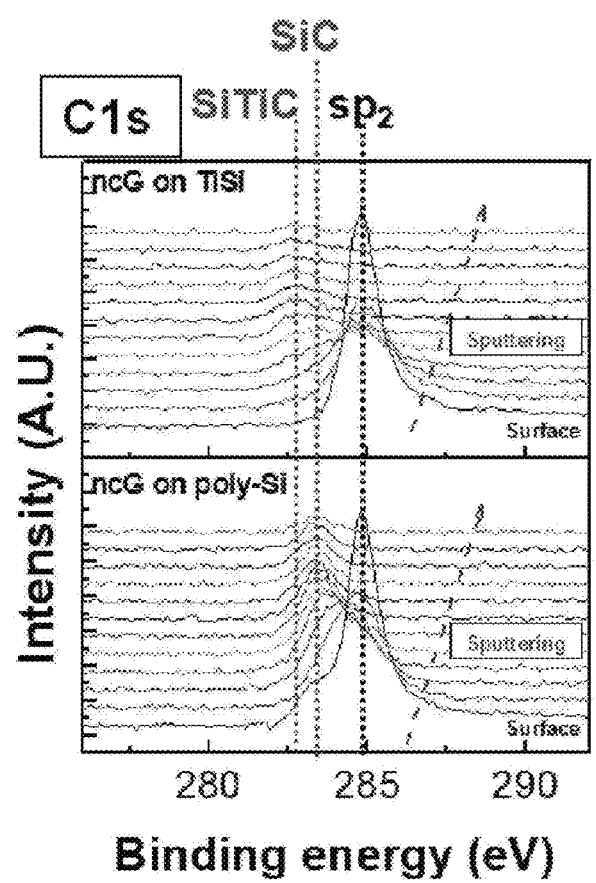
FIG. 11 illustrates a graph showing a characteristic of forming a titanium-carbon (Ti—C) bond when titanium silicide (TiSi) is formed by inserting a Ti layer on polysilicon (poly-Si) and nanocrystalline graphene (ncG) is formed on the TiSi.

FIG. 11 illustrates a graph showing a characteristic of forming a titanium-carbon (Ti—C) bond when TiSi is formed by inserting a Ti layer on polysilicon (poly-Si) and nanocrystalline graphene (ncG) is formed on the TiSi.

As shown in FIG. 11, when ncG is directly grown on poly-Si without inserting a Ti layer, a silicon-carbon (Si—C) bond having a weaker bonding force than a Ti—C bond is formed at an interface between the poly-Si and the ncG as shown in the lower graph (ncG on poly-Si) of FIG. 11. However, when silicide, i.e., TiSi, is formed at an interface between poly-Si and a Ti layer by growing ncG in a state where the Ti layer is formed on the poly-Si, an SiTiC bond, i.e., a Ti—C bond having a stronger bonding force that an Si—C bond, is formed instead of the Si—C bond as shown in the upper graph (ncG on TiSi) of FIG. 11.

Figure 12:
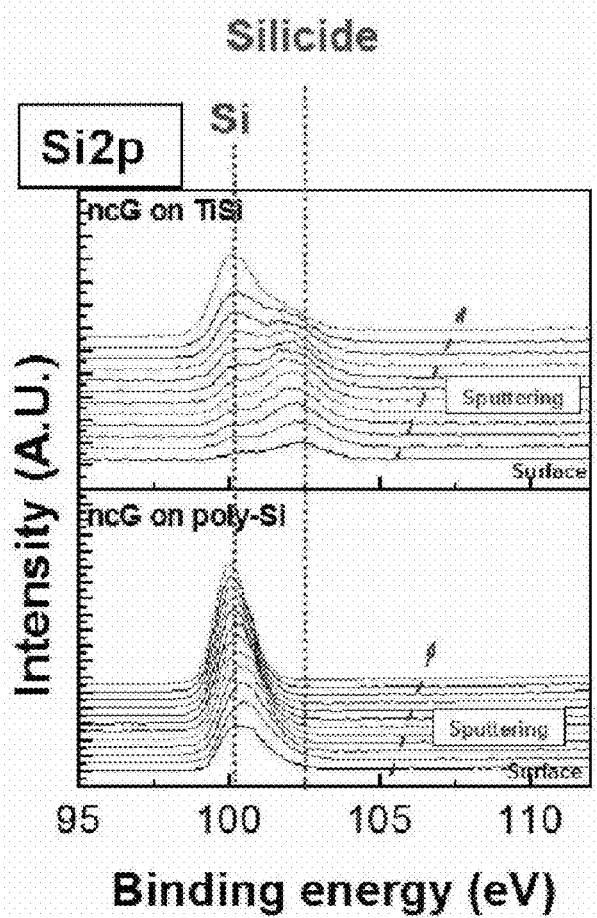
FIG. 12 illustrates a graph showing a characteristic of forming silicide when TiSi is formed by inserting a Ti layer on poly-Si and ncG is formed on the TiSi.

FIG. 12 illustrates a graph showing a characteristic of forming silicide when TiSi is formed by inserting a Ti layer on poly-Si and ncG is formed on the TiSi.

As shown in FIG. 12, when ncG is directly grown on poly-Si without inserting a Ti layer, silicide is not formed at an interface between the poly-Si and the ncG as shown in the lower graph (ncG on poly-Si) of FIG. 12. However, when silicide, i.e., TiSi, is formed at an interface between poly-Si and a Ti layer by growing ncG in a state where the Ti layer is formed on the poly-Si, silicide is formed as shown in the upper graph (ncG on TiSi) of FIG. 12.

FIGS. 13A through 13F illustrate an operation of manufacturing a hybrid interconnect structure according to example embodiments. In example embodiments, the hybrid interconnect structure 600 of FIG. 6 is manufactured as an example. Except that some processed may be omitted according to no existence of the first bonding layer 20 and/or the second bonding layer 50, an operation of the hybrid interconnect structures 200, 300, 400, and 500 of FIGS. 2 through 6 may also be sufficiently inferred, and thus, a description thereof is omitted.

Figure 13A:
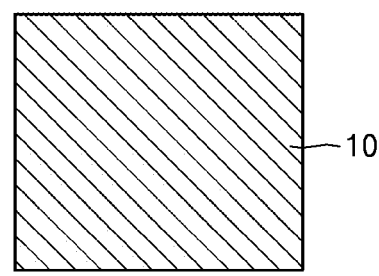
FIGS. 13A through 13F illustrate an operation of manufacturing a hybrid interconnect structure according to example embodiments.

First, referring to FIG. 13A, to manufacture the hybrid interconnect structure 600, a substrate having the non-metallic material layer 10 is prepared. The substrate having the non-metallic material layer 10 may be a silicon substrate.

Figure 13B:
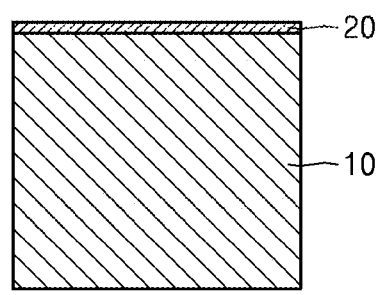
Figure 13C:
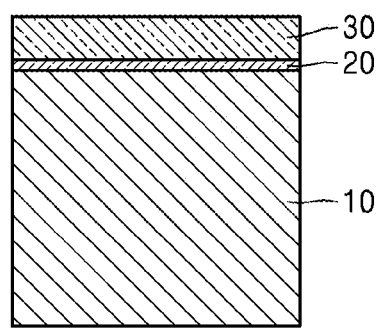

Next, as shown in FIGS. 13B and 13C, the first bonding layer 20 is formed on the non-metallic material layer 10, and then the graphene layer 30 is grown on the first bonding layer 20. In this case, the first bonding layer 20 may be, for example, a Ti layer, and the graphene layer 30 may include a nanocrystalline graphene layer. The graphene layer 30 may further include a transferred graphene layer. The graphene layer 30 may be doped with the doping element described above.

Figure 13D:
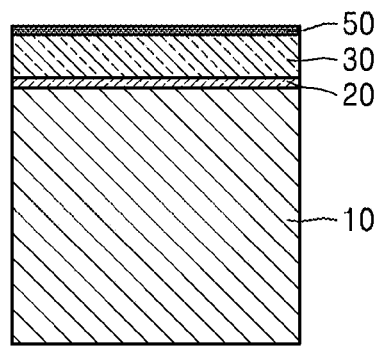

After forming the graphene layer 30, as shown in FIG. 13D, the second bonding layer 50 is formed on the graphene layer 30. The second bonding layer 50 may be, for example, a Ti layer.

Figure 13E:
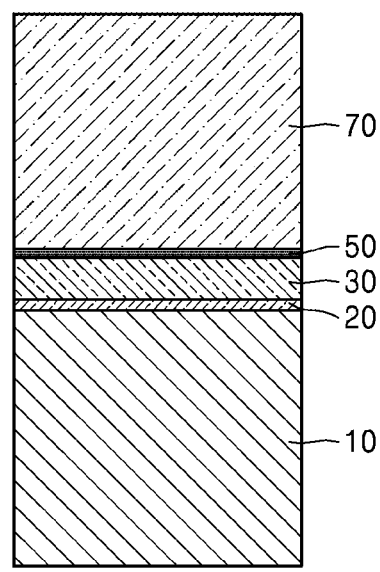
Figure 13F:
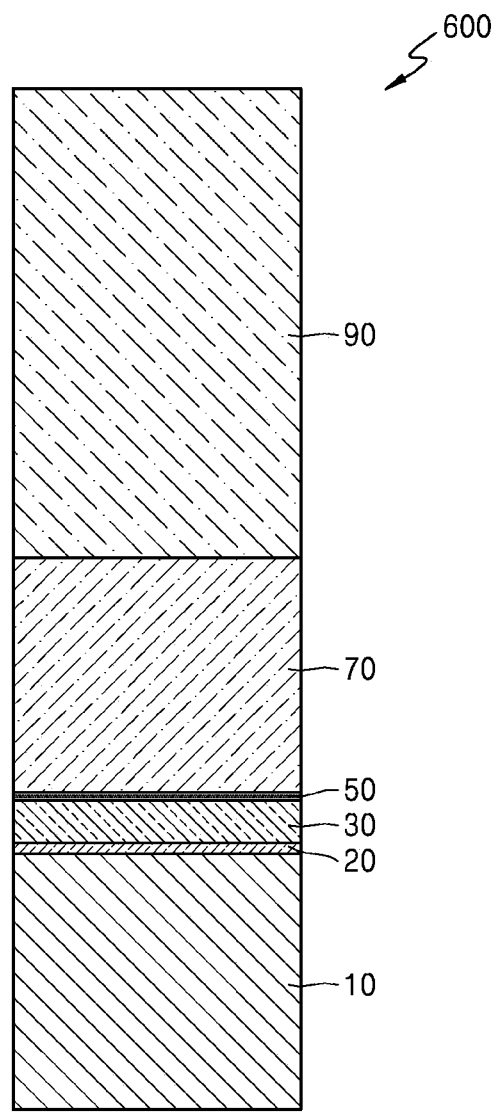

Next, as shown in FIG. 13E, the metal layer 70 is formed on the second bonding layer 50. The metal layer 70 may include, for example, W. The metal layer 70 may be formed by, for example, deposition.

According to circumstances, an additional material layer, e.g., the dielectric layer 90, may be further formed on the metal layer 70. The dielectric layer 90 may be formed by, for example, depositing an SiNx layer, etc.

The hybrid interconnect structures 100, 200, 300, 400, 500, and 600 according to example embodiments described above may be applied to various electronic devices including a plurality of elements. The plurality of elements may include, for example, at least one of a transistor, a capacitor, and a resistor. The hybrid interconnect structures 100, 200, 300, 400, 500, and 600 according to example embodiments may be applied to a connection between the plurality of elements, a connection in each element, a connection between unit cells formed by combining the plurality of elements, and a connection between chips manufactured by combining a plurality of unit cells.

Figure 14:
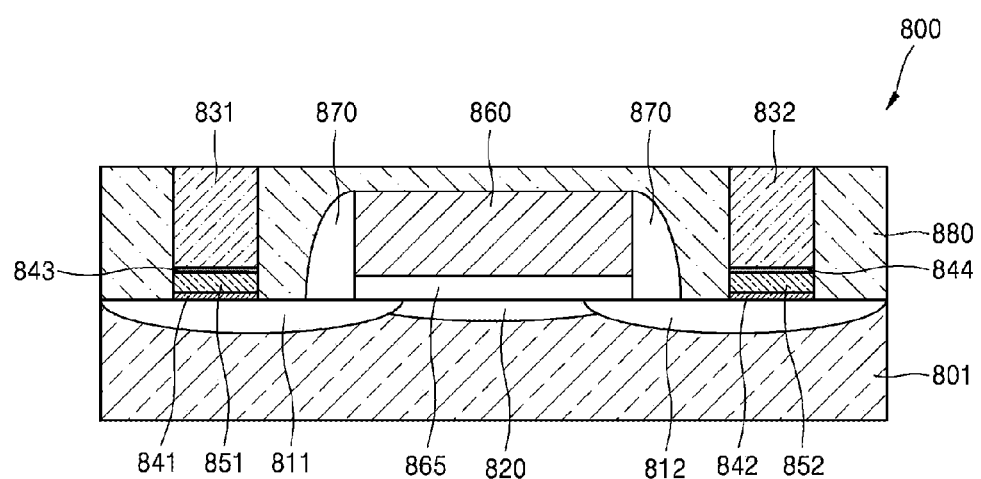
FIG. 14 illustrates a semiconductor device as an example of an electronic device employing a hybrid interconnect structure, according to example embodiments.

FIG. 14 illustrates a semiconductor device 800 as an example of an electronic device employing a hybrid interconnect structure, according to example embodiments. FIG. 14 illustrates a transistor as the semiconductor device 800.

Referring to FIG. 14, first and second electrodes 831 and 832 are prepared on both sides of a substrate 801, and a gate electrode 860 is prepared between the first and second electrodes 831 and 832 on the substrate 801. The substrate 801 may include a semiconductor. For example, the substrate 801 may include Si but is not limited thereto. In addition, the substrate 801 may be doped in a p type or an n type. A first region 811 may be formed on one side of an upper surface of the substrate 801, and a second region 812 may be formed on the other side of the upper surface of the substrate 801. The first and second regions 811 and 812 may be doped at a high density. The first and second regions 811 and 812 may become a source region and a drain region, respectively. Alternatively, the first and second regions 811 and 812 may become the drain region and the source region, respectively. A channel 820 may be formed between the first and second regions 811 and 812 on the upper surface of the substrate 801.

The first electrode 831 is formed on the first region 811 of the substrate 801, and the second electrode 832 is formed on the second region 812 of the substrate 801. The first and second electrodes 831 and 832 may become a source electrode and a drain electrode, respectively. Alternatively, the first and second electrodes 831 and 832 may become the drain electrode and the source electrode, respectively. The first and second electrodes 831 and 832 may include a highly conductive metal. A first hybrid interconnect structure is provided between the first electrode 831 and the first region 811 of the substrate 801, and a second hybrid interconnect structure is provided between the second electrode 832 and the second region 812 of the substrate 801. The first hybrid interconnect structure may have a stacked structure of a first bonding layer 841, a graphene layer 851 and a second bonding layer 843, and the second hybrid interconnect structure may have a stacked structure of a first bonding layer 842, a graphene layer 852 and a second bonding layer 844. The first and second regions 811 and 812 of the substrate 801 may correspond to the non-metallic material layer 10 of the hybrid interconnect structures 100, 200, 300, 400, 500, and 600 according to example embodiments described above, and the first bonding layers 841 and 842, the graphene layers 851 and 852, and the second bonding layers 843 and 844 may correspond to the first bonding layer 20, the graphene layer 30, and the second bonding layer 50 of the hybrid interconnect structures 100, 200, 300, 400, 500, and 600 according to example embodiments described above, respectively. Also, the first and second electrodes 831 and 832 may correspond to the metal layer 70 of the hybrid interconnect structures 100, 200, 300, 400, 500, and 600 according to example embodiments described above.

The channel 820 is formed between the first and second regions 811 and 812 on the upper surface of the substrate 801. In addition, a gate insulating layer 865 and a gate electrode 860 are sequentially provided on the channel 820 of the substrate 801. The gate insulating layer 865 may include, for example, silicon oxide or silicon nitride, and the gate electrode 860 may include a highly conductive metal. In addition, a spacer 870 may be further provided around the gate electrode 860 and the gate insulating layer 865 on the substrate 801. The spacer 870 may function to protect side surfaces of the gate electrode 860 and to adjust doping in the first and second regions 811 and 812. The spacer 870 may include, for example silicon nitride. In addition, an insulating layer 880 may be further provided on the substrate 801 so as to cover the gate electrode 860 and the spacer 870.

When a metal is deposited on a graphene layer, a grain size of the deposited metal layer may expand. In this case, a resistance of the metal layer may be reduced. That is, a metal layer is formed on the graphene layer, the graphene layer functions as a grain expansion layer for the metal layer. Therefore, when forming the graphene layer, i.e., the grain expansion layer, and then forming the metal layer on the graphene layer, a grain size of the metal layer may expand due to the grain expansion layer.

Because the semiconductor device 800 shown in FIG. 14 includes the first and second hybrid interconnect structures including the graphene layers 851 and 852 between the first electrode 831 and the substrate 801 and between the second electrode 832 and the substrate 801, respectively, grain sizes of the second bonding layers 843 and 844 and the first and second electrodes 831 and 832 may expand while forming the second bonding layers 843 and 844 and the first and second electrodes 831 and 832 of a metallic material on the graphene layers 851 and 852. Therefore, a resistance of the second bonding layers 843 and 844 and the first and second electrodes 831 and 832 may be reduced, and thus, a total resistance of the first and second hybrid interconnect structures may be reduced, thereby implementing a low-resistance wiring. In addition, the first bonding layers 841 and 842 may be provided between the graphene layers 851 and 852 and the substrate 801, and the second bonding layers 843 and 844 may be provided between the graphene layers 851 and 852 and the first and second electrodes 831 and 832, and thus an adhesion may be improved. Therefore, even when a relatively thick dielectric layer is formed on the first and second electrodes 831 and 832, cracks do not occur, and an interface of each of the first and second hybrid interconnect structures is not easily separated.

Figure 15:
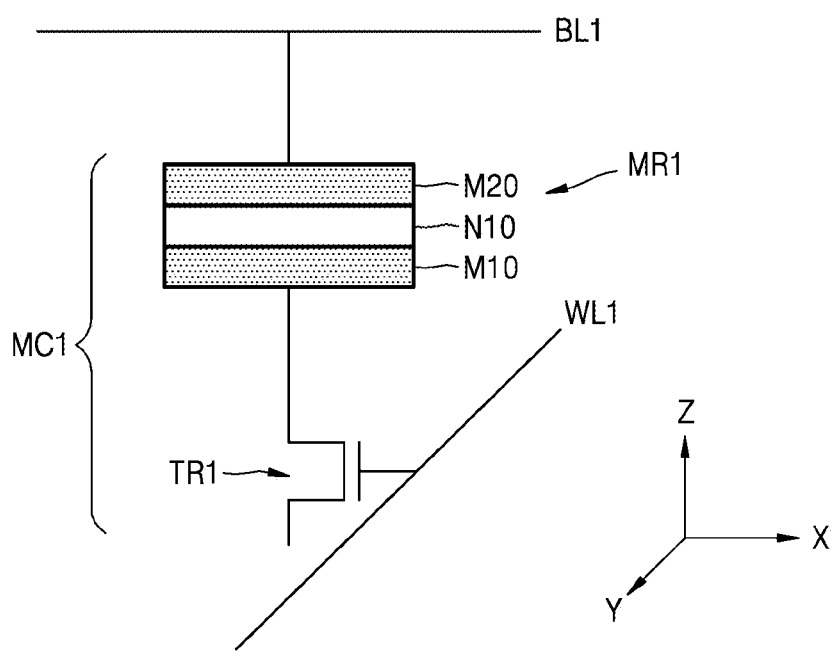
FIG. 15 illustrates a memory device as another example of the electronic device, according to example embodiments.

FIG. 15 illustrates a memory device as another example of the electronic device, according to example embodiments.

Referring to FIG. 15, in the memory device according to example embodiments, a memory cell MC1 may include a magneto-resistance element MR1 and a switching element TR1 connected to the magneto-resistance element MR1 and may be connected between a bit line BL1 and a word line WL1.

The hybrid interconnect structure 100, 200, 300, 400, 500, or 600 according to example embodiments described above may be applied to at least one of the bit line BL1 and the word line WL1, e.g., the bit line BL1.

The bit line BL1 and the word line WL1 may cross, and the memory cell MC1 may be placed at a cross point of the bit line BL1 and the word line WL1. The bit line BL1 may be connected to the magneto-resistance element MR1. In detail, a second magnetic material layer M20 of the magneto-resistance element MR1 may be electrically connected to the bit line BL1. The word line WL1 may be connected to the switching element TR1. When the switching element TR1 is a transistor, the word line WL1 may be connected to a gate electrode of the switching element TR1. A write current, a read current, a delete current, etc., may be applied to the memory cell MC1 through the word line WL1 and the bit line BL1.

The magneto-resistance element MR1 may include first and second magnetic material layers M10 and M20 and a non-magnetic layer N10 between the first and second magnetic material layers M10 and M20. One of the first and second magnetic material layers M10 and M20, e.g., the first magnetic material layer M10, may be a free layer, and the other one thereof, e.g., the second magnetic material layer M20, may be a fixed layer.

The switching element TR1 may be, for example, a transistor. The switching element TR1 may be electrically connected to the first magnetic material layer M10 of the magneto-resistance element MR1.

Although FIG. 15 shows one memory cell MC1, a plurality of memory cells MC1 may be arranged in an array. That is, a plurality of bit lines BL1 and a plurality of word lines WL1 may cross each other, and the plurality of memory cells MC1 may be provided at cross points of the plurality of bit lines BL1 and the plurality of word lines WL1, respectively.

Figure 16:
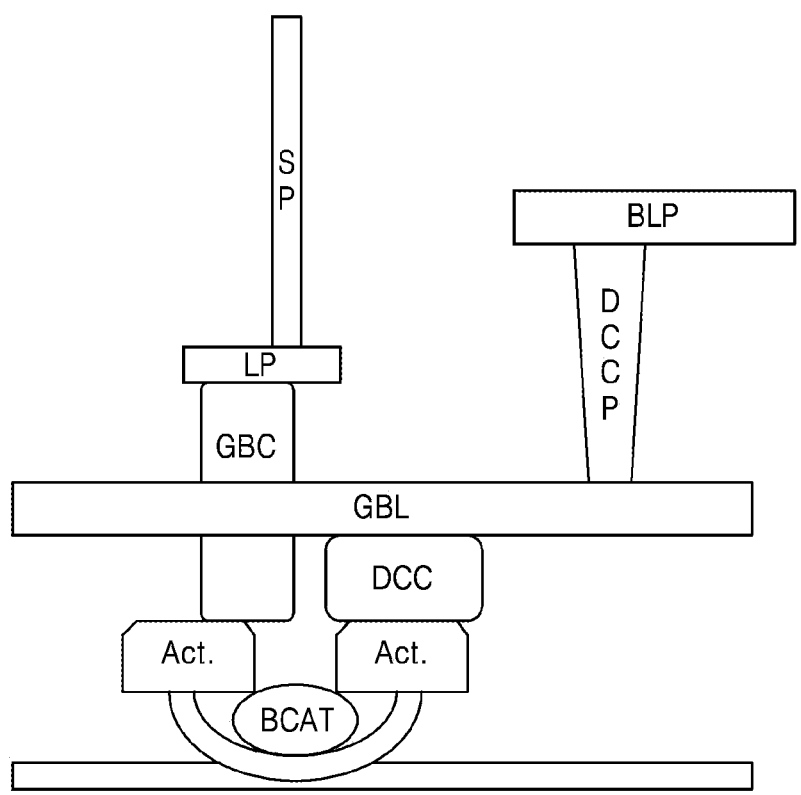
FIG. 16 illustrates a dynamic random access memory (DRAM) as another example of the electronic device, according to example embodiments.

FIG. 16 illustrates a dynamic random access memory (DRAM) as another example of the electronic device, according to example embodiments.

Referring to FIG. 16, in the DRAM, a signal input through a gate bit line GBL is connected to an active layer Act at a lower part of the DRAM through a duty cycle compensation unit DCC and is transferred to an active layer Act at an opposite side through a transistor operation of a buried channel array transistor BCAT. The transferred signal is stored as information in a capacitor SP through a gate body serial contact GBC.

In the DRAM, the hybrid interconnect structure 100, 200, 300, 400, 500, or 600 according to example embodiments described above may be applied to the gate bit line GBL.

Although the electronic devices which may employ the hybrid interconnect structure 100, 200, 300, 400, 500, or 600 according to example embodiments are illustrated, the example embodiments are not limited thereto, and the hybrid interconnect structure 100, 200, 300, 400, 500, or 600 according to example embodiments may be applied to various electronic devices.

According to a hybrid interconnect structure and an electronic device employing the same according to example embodiments, by inserting a bonding layer for interfacial bonding into at least one of between a graphene layer and a non-metallic material layer and between the graphene layer and a metal layer in a stacked structure of the non-metallic material layer, the graphene layer, and the metal layer, a low-resistance hybrid interconnect structure may be implemented, and an adhesion may be improved.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A hybrid interconnect structure comprising:
   a graphene layer between a non-metallic material layer and a metal layer, the graphene layer connecting the non-metallic material layer and the metal layer; and
   a first interfacial bonding layer between the non-metallic material layer and the graphene layer, or the metal layer and the graphene layer, the first interfacial bonding layer including a metallic material.

2. The hybrid interconnect structure of claim 1, wherein the first interfacial bonding layer is between the non-metallic material layer and the graphene layer.

3. The hybrid interconnect structure of claim 2, wherein
   the first interfacial bonding layer interacts with graphene at an interface with the graphene layer to form a carbide; and
   the first interfacial bonding layer includes at least one of titanium (Ti), zirconium (Zr), hafnium (Hf), vanadium (V), niobium (Nb), tantalum (Ta), chromium (Cr), molybdenum (Mo), tungsten (W), and an alloy thereof.

4. The hybrid interconnect structure of claim 2, wherein the non-metallic material layer is one of a semiconductor substrate and a semiconductor material layer on a substrate.

5. The hybrid interconnect structure of claim 2, wherein
the non-metallic material layer includes a silicon material;
the first interacial bonding layer interacts with graphene layer at an interface with the graphene layer to form a carbide; and
the first interfacial bonding layer interacts with the silicon material at an interface with the non-metallic material layer to form a silicide.

6. The hybrid interconnect structure of claim 5, wherein
the first interfacial bonding layer includes a titanium (Ti) layer;
the Ti layer interacts with graphene at an interface with the graphene layer to form titanium carbide (TiC); and
the Ti layer interacts with the silicon material at an interface with the non-metallic material layer to form a titanium silicide (TiSi).

7. The hybrid interconnect structure of claim 5, wherein the non-metallic material layer is one of a semiconductor substrate and a semiconductor material layer on a substrate.

8. The hybrid interconnect structure of claim 2, further comprising:
a second bonding layer between the graphene layer and the metal layer, the second bonding layer including a metallic material.

9. The hybrid interconnect structure of claim 8, wherein
the second bonding layer interacts with graphene at an interface with the graphene layer to form a carbide; and
the second bonding layer includes at least one of Ti, Zr, Hf, V, Nb, Ta, Cr, Mo, W, and an alloy thereof.

10. The hybrid interconnect structure of claim 8, wherein the second bonding layer is one of a continuous thin-film and an island pattern.

11. The hybrid interconnect structure of claim 1, wherein the first interfacial bonding layer is between the graphene layer and the metal layer.

12. The hybrid interconnect structure of claim 11, wherein
the first interfacial bonding layer interacts with graphene at an interface with the graphene layer to form a carbide; and
the first interfacial bonding layer includes at least one of Ti, Zr, Hf, V, Nb, Ta, Cr, Mo, W, and an alloy thereof.

13. The hybrid interconnect structure of claim 1, wherein the first interfacial bonding layer is one of a continuous thin-film and an island pattern.

14. The hybrid interconnect structure of claim 1, wherein the graphene layer includes a nanocrystalline graphene layer.

15. The hybrid interconnect structure of claim 14, wherein the nanocrystalline graphene layer has at least one of a thickness of 4 mm or less, a 2D/G ratio of a Raman spectrum of 0.1 or more and a D/G ratio of 3 or less, and a crystal size of 1 nm or more.

16. The hybrid interconnect structure of claim 14, wherein the nanocrystalline graphene layer has a crystal size in a range of about 1 nm to about 200 nm.

17. The hybrid interconnect structure of claim 14, wherein the nanocrystalline graphene layer is on the non-metallic material layer.

18. The hybrid interconnect structure of claim 14, wherein
the first interfacial bonding layer is between the non-metallic material layer and the nanocrystalline graphene layer;
the nanocrystalline graphene layer interacts with the first bonding layer to form a carbide; and
the nanocrystalline graphene layer contacts the first interfacial bonding layer.

19. The hybrid interconnect structure of claim 1, wherein the non-metallic material layer is one of a semiconductor substrate and a semiconductor material layer on a substrate.

20. An electronic device comprising:
a plurality of elements, each of the plurality of elements including at least one of a transistor, a capacitor, and a resistor; and
the hybrid interconnect structure of claim 1 configured to connect at least one of the plurality of elements, components within each element, unit cells formed by combining the plurality of elements, and chips manufactured by combining a plurality of unit cells.

* * * * *